(12) United States Patent
Choi et al.

(10) Patent No.: US 10,622,434 B2
(45) Date of Patent: Apr. 14, 2020

(54) ORGANIC LIGHT EMITTING DISPLAY DEVICE INCLUDING AN ORGANIC LIGHT EMITTING DIODE CONNECTED TO CONNECTION ELECTRODES

(71) Applicant: Samsung Display Co., Ltd., Yongin-si, Gyeonggi-Do (KR)

(72) Inventors: Sang Moo Choi, Yongin-si (KR); Mi Hae Kim, Asan-si (KR); Sang Won Seok, Gwangmyeong-si (KR); Hwan Soo Jang, Asan-si (KR); Su Jin Lee, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/034,180

(22) Filed: Jul. 12, 2018

(65) Prior Publication Data
US 2019/0172888 A1 Jun. 6, 2019

(30) Foreign Application Priority Data

Dec. 6, 2017 (KR) .................. 10-2017-0166778

(51) Int. Cl.
*H01L 27/32* (2006.01)
*H01L 51/52* (2006.01)
(Continued)

(52) U.S. Cl.
CPC ....... *H01L 27/3276* (2013.01); *G09G 3/3258* (2013.01); *H01L 27/3246* (2013.01);
(Continued)

(58) Field of Classification Search
CPC .................................................. H01L 27/3276
(Continued)

(56) References Cited

U.S. PATENT DOCUMENTS 7,030,556 B2 * 4/2006 Adachi ............... H01L 27/3246
313/506
2002/0025391 A1 * 2/2002 Angelopoulos ........ C08G 61/12
428/1.4
(Continued)

FOREIGN PATENT DOCUMENTS

| KR | 10-0560780 B1 | 3/2006 |
| KR | 10-2015-0064543 A | 6/2015 |
| KR | 10-2017-0012738 A | 2/2017 |

*Primary Examiner* — Jami Valentine Miller
(74) *Attorney, Agent, or Firm* — Innovation Counsel LLP

(57) ABSTRACT

An organic light emitting display device includes a substrate having a display area and a peripheral area; a pad disposed on the substrate in the peripheral area; a first conductive pattern disposed on one side of the display area in the peripheral area and electrically connected to the pad; a second conductive pattern disposed on the substrate in the peripheral area and disposed on an opposite side of the first conductive pattern with the display area interposed between the first conductive pattern and the second conductive pattern; a first connection electrode disposed on the first conductive pattern in the peripheral area and electrically connected to the first conductive pattern; and a second connection electrode disposed on the second conductive pattern in the peripheral area and electrically connected to the second conductive pattern. A cathode electrode of an organic light emitting diode is disposed on the first and second connection electrodes and electrically connected to the first and second connection electrodes.

20 Claims, 11 Drawing Sheets

(51) Int. Cl.
*G09G 3/3258* (2016.01)
*G09G 3/3266* (2016.01)
*G09G 3/3291* (2016.01)
*G09G 3/3233* (2016.01)

(52) U.S. Cl.
CPC ...... *H01L 27/3258* (2013.01); *H01L 51/5218* (2013.01); *H01L 51/5234* (2013.01); *G09G 3/3233* (2013.01); *G09G 3/3266* (2013.01); *G09G 3/3291* (2013.01); *G09G 2300/0426* (2013.01); *G09G 2300/0842* (2013.01); *G09G 2310/0251* (2013.01); *G09G 2310/0262* (2013.01)

(58) Field of Classification Search
USPC .......................................................... 257/40
See application file for complete search history.

(56) References Cited

U.S. PATENT DOCUMENTS

| | | | |
|---|---|---|---|
| 2005/0140285 A1* | 6/2005 | Park | H01L 27/3246 |
| | | | 313/506 |
| 2010/0213482 A1* | 8/2010 | Kim | H01L 27/3248 |
| | | | 257/98 |
| 2016/0293883 A1* | 10/2016 | Hong | H01L 27/3258 |
| 2018/0018052 A1* | 1/2018 | Yang | G06F 3/0412 |
| 2019/0123121 A1* | 4/2019 | Liu | H01L 27/3265 |

* cited by examiner

ORGANIC LIGHT EMITTING DISPLAY DEVICE INCLUDING AN ORGANIC LIGHT EMITTING DIODE CONNECTED TO CONNECTION ELECTRODES

CROSS-REFERENCE TO RELATED APPLICATION

This application claims priority from Korean Patent Application No. 10-2017-0166778 filed on Dec. 6, 2017 in the Korean Intellectual Property Office, and all the benefits accruing therefrom under 35 U.S.C. 119, the disclosure of which is herein incorporated by reference in its entirety.

BACKGROUND

1. Technical Field

The present disclosure relates to an organic light emitting display device.

2. Description of the Related Art

It has become essential that a display device is used as one of user interfaces of an electronic device, and various kinds of display devices have been developed. Typically, an organic light emitting diode (OLED) is a display device that displays an image using a self-illumination phenomenon of a fluorescent organic compound that emits light when current flows therethrough.

An organic light emitting display device includes a plurality of pixels that is arranged in a display area that corresponds to an area where an image is displayed. Each of the pixels includes a plurality of driving transistors.

In addition to the control of light emission of the corresponding pixel, the driving transistor can provide threshold voltage compensation for preventing a stain from being viewed that may be caused by deterioration of the pixels, a difference in characteristics between adjacent pixels, or initialization of some nodes in the pixels. In addition, the driving transistor may collect data used for the threshold voltage compensation of the fluorescent organic compound.

Meanwhile, each of the pixels may be provided with a plurality of signals and source voltages to perform the driving.

However, distances between the respective pixels and a portion from which the plurality of signals and source voltages are applied may be different causing a difference in the characteristics (e.g., resistance) of paths in which the signals and the source voltages are provided. Therefore, a deviation may occur between the signals and source voltages provided to the respective pixels, and the display quality of the display device may be deteriorated.

SUMMARY

Aspects of the present disclosure provide an organic light emitting display device capable of minimizing a deviation between signals and source voltages that are provided to respective pixels.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

An embodiment may be related an organic light emitting display device. The organic light emitting display device includes a substrate having a display area in which a plurality of pixels including an organic light emitting diode is arranged and a peripheral area surrounding the display area; a pad disposed on the substrate in the peripheral area; a first conductive pattern disposed on one side of the display area in the peripheral area and electrically connected to the pad; a second conductive pattern disposed on the substrate in the peripheral area and disposed on an opposite side of the first conductive pattern with the display area interposed between the first conductive pattern and the second conductive pattern; a first connection electrode disposed on the first conductive pattern in the peripheral area and electrically connected to the first conductive pattern; and a second connection electrode disposed on the second conductive pattern in the peripheral area and electrically connected to the second conductive pattern, wherein a cathode electrode of the organic light emitting diode is disposed on the first connection electrode and the second connection electrode and electrically connected to the first connection electrode and the second connection electrode.

Another embodiment may be related an organic light emitting display device. The organic light emitting display device includes a substrate having a display area in which a plurality of pixels including an organic light emitting diode is arranged and a peripheral area surrounding the display area; a pad disposed on the substrate in the peripheral area and a conductive pattern electrically connected to the pad and disposed to surround the display area; and a first connection electrode and a second connection electrode disposed on the conductive pattern in the peripheral area and electrically connected to the conductive pattern, wherein a cathode electrode of the organic light emitting diode is disposed on the first connection electrode and the second connection electrode and electrically connected to the first connection electrode and the second connection electrode, wherein the first connection electrode is disposed in the peripheral area adjacent to one end of the display area in which the pad is disposed, and wherein the second connection electrode is disposed in the peripheral area opposite to the first connection electrode with the display area interposed between the first connection electrode and the second connection electrode.

According to embodiments of the present disclosure, it is possible to provide an organic light emitting display device capable of minimizing a deviation between signals and source voltages provided to respective pixels.

The effects of the present disclosure are not limited to the aforementioned effects, and various other effects are included in the present disclosure.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
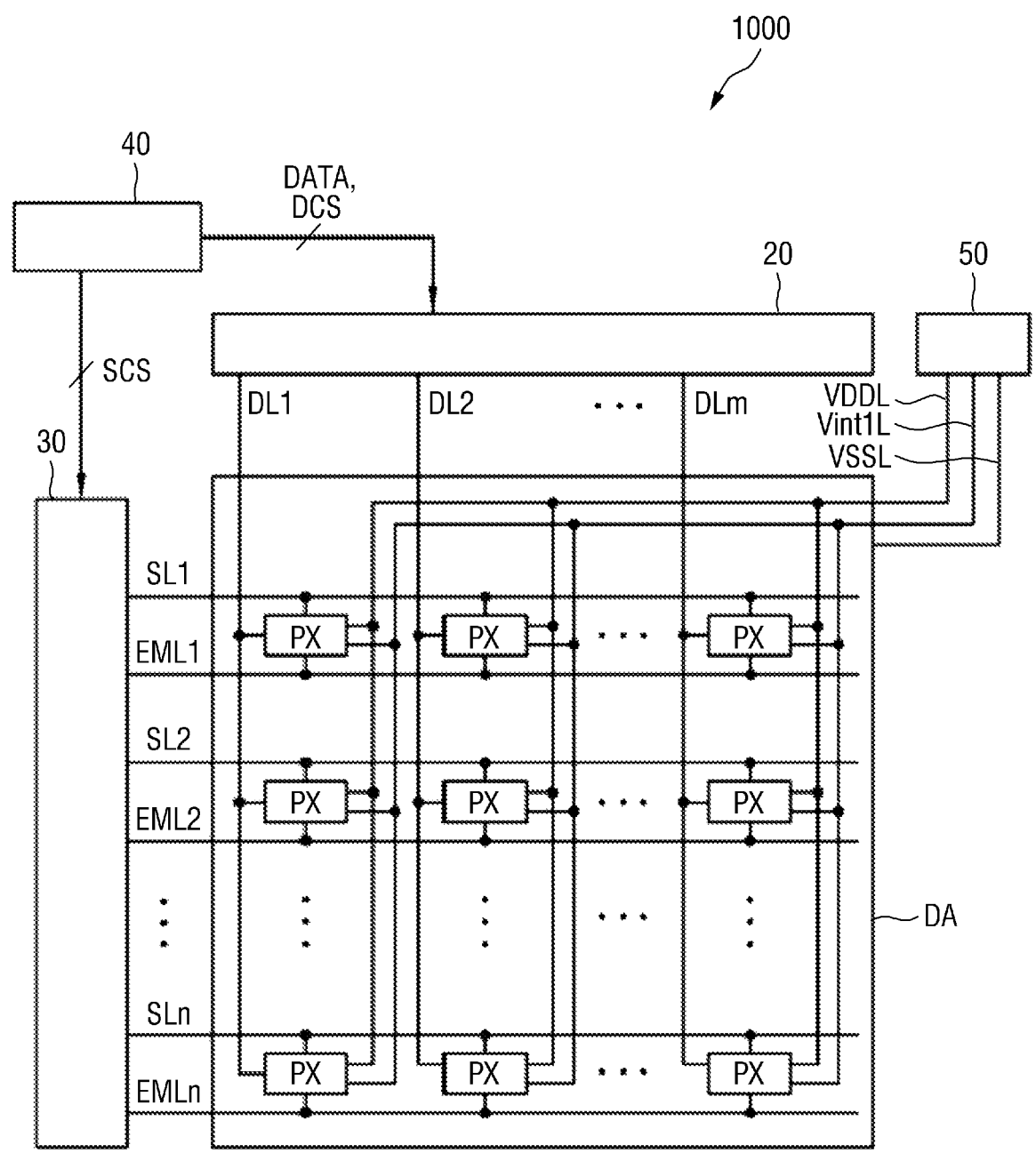
FIG. 1 is a block diagram of an organic light emitting display device, according to an embodiment of the present disclosure.

Example embodiments are described with reference to the accompanying drawings. The example embodiments may be embodied in many different forms and should not be construed as being limited thereto. Like reference numerals may refer to like elements throughout the present disclosure.

Although the terms "first", "second", etc. may be used herein to describe various elements, these elements should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

When a first element is referred to as being "on", "connected to" or "coupled to" a second element or layer, the first element can be directly on, connected or coupled to the second element, or one or more intervening elements may be present between the first element and the second element. In contrast, when a first element is referred to as being "directly on", "directly connected to" or "directly coupled to" a second element or layer, there may be no intended intervening elements (except environmental elements such as air) present between the first element and the second element. The term "and/or" may include any and all combinations of one or more of the associated items.

Throughout the present disclosure, identical or similar parts will be referred to as identical reference numerals.

Hereinafter, embodiments of the present disclosure will be described with reference to the drawings.

FIG. 1 is a block diagram of an organic light emitting display device, according to an embodiment of the present disclosure.

Referring to FIG. 1, an organic light emitting display device 1000 includes a plurality of pixels PX, a data driver 20, a scan driver 30, a timing controller 40, and a power supply unit 50.

The plurality of pixels PX is arranged in a display area DA. Data lines DL1 to DLm (m is a natural number of 2 or more) and scan lines SL1 to SLn (n is a natural number of 2 or more) are arranged to intersect with each other in the display area DA. Further, emission lines EML1 to EMLn may be arranged in parallel with the scan lines SL1 to SLn in the display area DA. However, the present disclosure is not limited thereto, and other lines may be additionally arranged in parallel to the scan lines SL1 to SLn and the emission lines EML1 to EMLn in the display area DA. For example, initialization lines (not shown) that performs driving for initializing a specific node of each pixel and the like may be additionally arranged.

The data driver 20 includes a plurality of source drive integrated circuits (ICs). The data driver 20 may receive digital video data DATA from the timing controller 40. The data driver 20 may convert the digital video data DATA into a gamma compensation voltage in response to a data timing control signal DCS that is also received from the timing controller 40 to generate a data signal, and may supply the data signal to the data lines DL1 to DLm in synchronization with a scan signal.

The scan driver 30 includes a circuit for generating and outputting a scan signal and a circuit for generating and outputting an emission signal. The circuits for generating and outputting the scan signal and the emission signal may be configured to include a shift register, a level shifter, an output buffer, and the like. The scan driver 30 may sequentially supply the scan signal to the scan lines SL1 to SLn and may sequentially output the emission signal to the emission lines EML1 to EMLn.

Meanwhile, when additional lines (e.g., initialization lines) are formed in parallel with the scan lines SL1 to SLn and the emission lines EML1 to EMLn in the display area DA, the scan driver 30 may further include at least one output circuit for outputting a signal to the additional lines.

The timing controller 40 receives the digital video data DATA from a host system (not shown) through an interface such as a Low Voltage Differential Signaling (LVDS) interface or a Transition Minimized Differential Signaling (TMDS) interface. Further, the timing controller 40 receives various timing signals such as a vertical synchronization signal, a horizontal synchronization signal, a data enable signal, and a dot clock. The timing controller 40 may generate timing control signals for controlling the operation timings of the data driver 20 and the scan driver 30 based on the timing signals. The timing control signals may include a scan timing control signal SCS for controlling the operation timing of the scan driver 30 and the data timing control signal DCS for controlling the operation timing of the data driver 20. The timing controller 40 may provide the scan timing control signal SCS to the scan driver 30 and the data timing control signal DCS to the data driver 20.

The power supply unit 50 provides a first source voltage ELVSS to each pixel PX through a first power line VSSL and a second source voltage ELVDD through a second power line VDDL, and provides a first initialization voltage Vint1 to each pixel PX through a first initialization line Vint1L. Hereinafter, a case where the first source voltage ELVSS is a low potential voltage, the second source voltage ELVDD is a high potential voltage, and the first initialization voltage Vint1 is a voltage with a level higher than the low potential voltage and lower than the high potential voltage will be mainly described.

Further, the power supply unit 50 may provide predetermined logic level voltages to the timing controller 40, and may provide a gate-on voltage and a gate-off voltage to the scan driver 30.

Hereinafter, a structure of each pixel PX will be described in detail.

Figure 2:
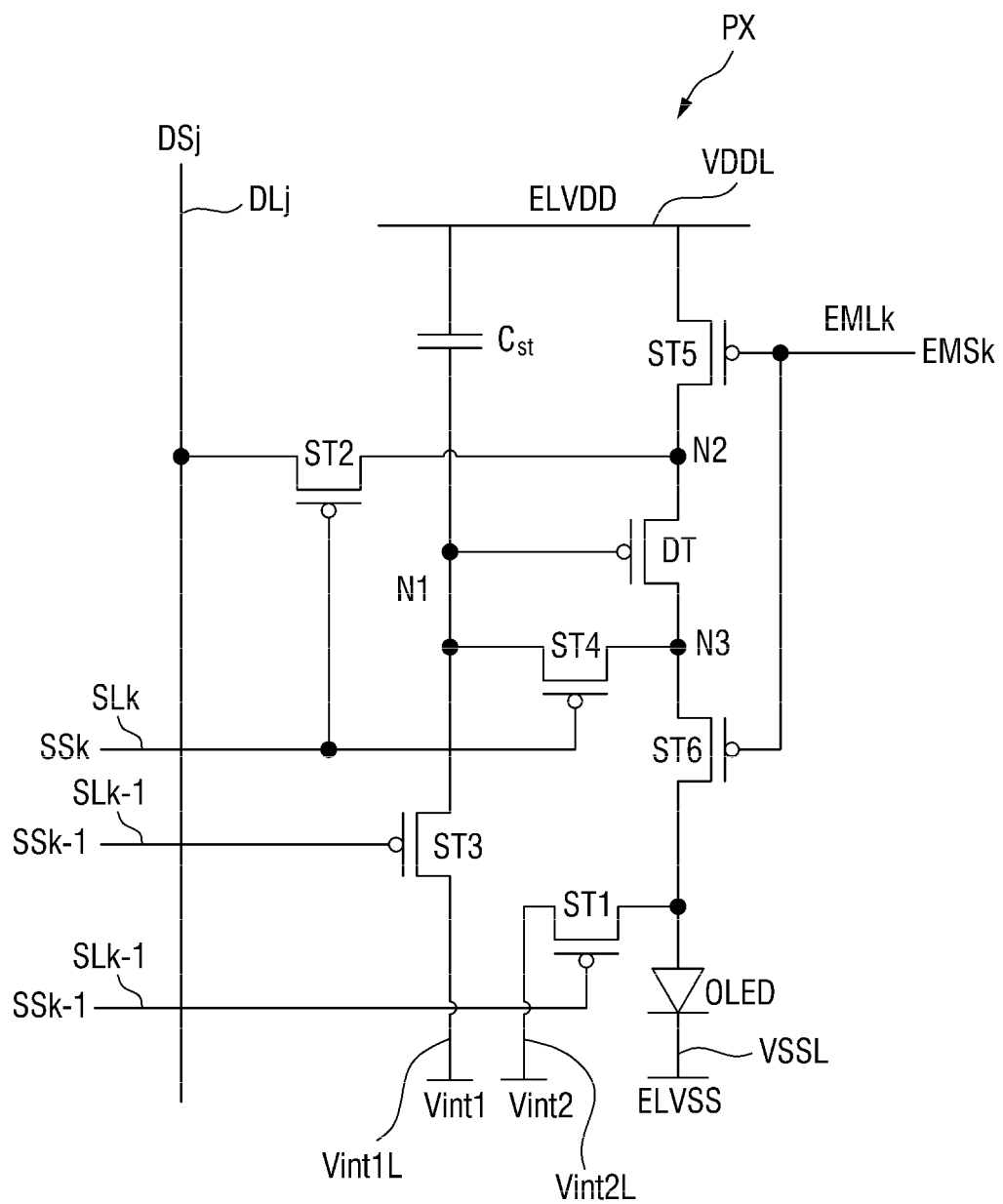
FIG. 2 is an equivalent circuit diagram of a pixel, according to an embodiment.

FIG. 2 is an equivalent circuit diagram of a pixel, according to an embodiment.

Referring to FIG. 2, a pixel PX includes a driving transistor DT, an organic light emitting diode OLED, a control circuit, a sustain capacitor Cst, and the like. The control circuit includes first to sixth transistors ST1 to ST6.

The pixel PX may be connected to a (k−1)th scan line SLk−1 (where k is a positive integer satisfying 2≤k≤n−1), a kth scan line SLk, a kth emission line EMLk and a jth data line DLj (where j is a positive integer satisfying 1≤j≤m). Further, the pixel PX may be connected to the first power line VSSL to which the first source voltage ELVSS is provided, the second power line VDDL to which the second source voltage ELVDD is provided, and the first initialization line Vint1L to which the first initialization voltage Vint1 is provided.

The driving transistor DT may control a drain-source current according to a voltage of a control electrode. The control electrode of the driving transistor DT is connected to a first node N1, the first electrode is connected to a second node N2, and the second electrode is connected to a third node N3. Here, the control electrode may be a gate electrode. The first electrode may be a source electrode or a drain electrode, and the second electrode may be an electrode different from the first electrode. For example, when the first electrode is the source electrode, the second electrode is the drain electrode.

The organic light emitting diode OLED emits light according to the drain-source current of the driving transistor DT. An anode electrode of the organic light emitting diode OLED may be connected to a first electrode of the first transistor ST1 and a second electrode of the sixth transistor ST6, and a cathode electrode of the organic light emitting diode OLED may be connected to the first power line VSSL.

The first transistor ST1 is connected to the anode electrode of the organic light emitting diode OLED. The first transistor ST1 may be turned on by the scan signal SSk−1 of the (k−1)th scan line SLk−1 to connect the anode electrode of the organic light emitting diode OLED to a second initialization line Vint2L to which a second initialization voltage Vint2 is provided. Thus, the anode electrode of the organic light emitting diode OLED may be discharged to the second initialization voltage Vint2. Here, the second initialization voltage Vint2 may be the same voltage as the first source voltage ELVSS. However, the first source voltage ELVSS may be provided to a second electrode of the first transistor ST1 through a path that is different from a path including the first power line VSSL although the second initialization voltage Vint2 may be substantially the same signal as the first source voltage ELVSS. The control electrode of the first transistor ST1 may be connected to the (k−1)th scan line SLk−1, a first electrode of the first transistor ST1 may be connected to the anode electrode of the organic light emitting diode OLED.

Meanwhile, since a path in which the first source voltage ELVSS is provided to each pixel PX and a path in which the second initialization voltage Vint2 is provided to each pixel PX are different from each other, the characteristics (e.g., resistance) of the paths may be different, and the difference may occur in the voltage levels of the first source voltage ELVSS and the second initialization voltage Vint2. The pixel PX arranged further away from a region from which the first source voltage ELVSS is provided may exhibit a larger difference in the voltage levels. However, according to a structure for applying the first source voltage ELVSS and the second initialization voltage Vint2, which will be described later, this voltage level difference can be minimized. The structure that can minimize the voltage level difference will be described later in further detail.

The second transistor ST2 is connected between the second node N2 and the jth data line DLj. The second transistor ST2 may be turned on by the scan signal SSk of the kth scan line SLk to connect the second node N2 to the jth data line DLj. Thus, the data signal DSk of the jth data line DLj may be provided to the second node N2. The control electrode of the second transistor ST2 may be connected to the kth scan line SLk, a first electrode of the second transistor ST2 may be connected to the jth data line DLj, and a second electrode of the second transistor ST2 may be connected to the second node N2.

The third transistor ST3 is connected between the first node N1 and the first initialization line Vint1L. The third transistor ST3 may be turned on by the scan signal SSk−1 of the (k−1)th scan line SLk−1 to connect the first node N1 to the first initialization line Vint1L to which the first initialization voltage Vint1 is provided. Thus, the first node N1 can be initialized to the first initialization voltage Vint1. The control electrode of the third transistor ST3 may be connected to the (k−1)th scan line SLk−1, a first electrode of the third transistor ST3 may be connected to the first node N1, and a second electrode of the third transistor ST3 may be connected to the first initialization line Vint1L.

The fourth transistor ST4 is connected between the first node N1 and the third node N3. The fourth transistor ST4 may be turned on by the scan signal SSk of the kth scan line SLk to connect the first node N1 to the third node N3. In this case, since the gate electrode and the second electrode of the driving transistor DT are connected to each other, the driving transistor DT may be driven as a diode. The gate electrode of the fourth transistor ST4 may be connected to the kth scan line SLk, a first electrode of the fourth transistor ST4 may be connected to the third node N3, and a second electrode of the fourth transistor ST4 may be connected to the first node N1.

The fifth transistor ST5 may be connected between the second power line VDDL and the second node N2. The fifth transistor ST5 may be turned on by the emission signal EMk of the kth emission line EMLk to connect the second node N2 to the second power line VDDL. Thus, the second source voltage ELVDD may be provided to the second node N2. The control electrode of the fifth transistor ST5 may be connected to the kth emission line EMLk, a first electrode of the fifth transistor ST5 may be connected to the second power line VDDL, and a second electrode of the fifth transistor ST5 may be connected to the second node N2.

The sixth transistor ST6 is connected between the third node N3 and the anode electrode of the organic light emitting diode OLED. The sixth transistor ST6 may be turned on by the emission signal of the kth emission line EMLk to connect the third node N3 to the anode electrode of the organic light emitting diode OLED. The control electrode of the sixth transistor ST6 may be connected to the kth emission line EMLk, a first electrode of the sixth transistor ST6 may be connected to the third node N3, and a second electrode of the sixth transistor ST6 may be connected to the organic light emitting diode OLED. By turning on the fifth and sixth transistors ST5 and ST6, the drain-source current of the driving transistor DT may be supplied to the organic light emitting diode OLED.

The sustain capacitor Cst is connected between the first node N1 and the second power line VDDL to maintain the voltage of the first node N1. One electrode of the sustain capacitor Cst may be connected to the first node N1 and the other electrode of the sustain capacitor Cst may be connected to the second power line VDDL.

The first node N1 is connected to the control electrode of the driving transistor DT. At the same time, the first node N1 may be a contact point between the first electrode of the third transistor ST3, the second electrode of the fourth transistor ST4, and one electrode of the sustain capacitor Cst.

The second node N2 is connected to the first electrode of the driving transistor DT. At the same time, the second node N2 may be a contact point between the first electrode of the driving transistor DT, the second electrode of the second transistor ST2, and the second electrode of the fifth transistor ST5.

The third node N3 is connected to the second electrode of the driving transistor DT. At the same time, the third node N3 may be a contact point of the second electrode of the driving transistor DT, the first electrode of the fourth transistor ST4, and the first electrode of the sixth transistor ST6.

A semiconductor layer of each of the first to sixth transistors ST1 to ST6 and the driving transistor DT may be formed of polysilicon, but is not limited thereto, and may be formed of any one of a-Si and an oxide semiconductor. When the semiconductor layer of each of the first to sixth transistors ST1 to ST6 and the driving transistor DT is formed of polysilicon, a process for forming the semiconductor layer may be performed using a low temperature polysilicon (LTPS) process.

Further, a case where the first to sixth transistors ST1 to ST6 and the driving transistor DT are formed of P-type metal oxide semiconductor field effect transistors (MOSFETs) will be mainly described, but is not limited thereto, and they may be formed of N-type MOSFETs.

The first and second source voltages ELVSS and ELVDD, and the first initialization voltage Vint1 may be set in consideration of the characteristics of the driving transistor DT, the characteristics of the organic light emitting diode OLED, and the like.

Figure 3:
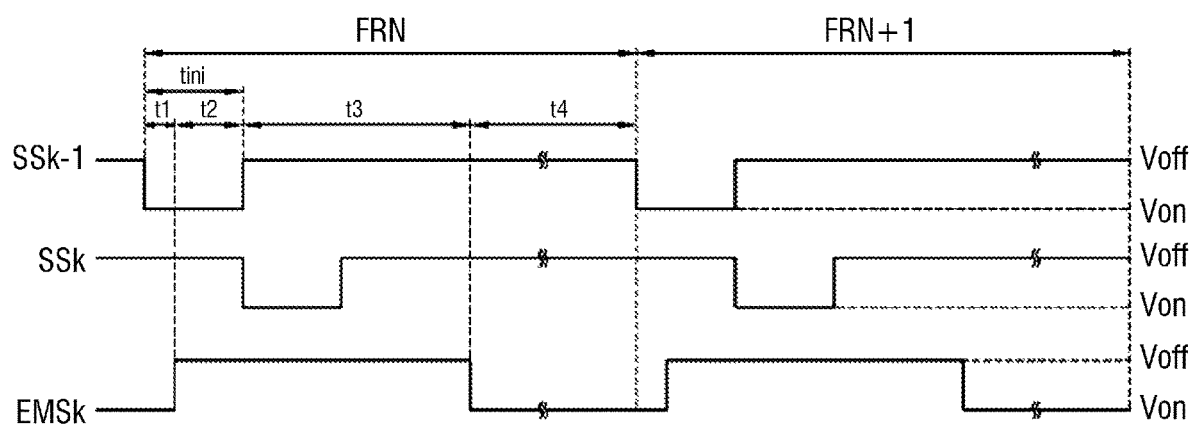
FIG. 3 is a timing diagram of some of signals inputted to a pixel according to the embodiment.

FIG. 3 is a timing diagram of some of the signals inputted to a pixel according to the embodiment.

FIG. 3 illustrates the (k−1)th scan line SLk−1 that is supplied to the (k−1)th scan line SLk−1, the kth scan signal SSk that is supplied to the kth scan line SLk, and the kth emission signal EMk that is supplied to the kth emission line EMLk during Nth frame (where N is a positive integer) and (N+1)th frame periods FRN and FRN+1.

Referring to FIG. 2, the (k−1)th scan signal SSk−1 is a signal for controlling the first and third transistors ST1 and ST3, the kth scan signal SSk is a signal for controlling the second and fourth transistors ST2 and ST4, and the kth emission signal EMk is a signal for controlling the fifth and sixth transistors ST5 and ST6. Each of the scan signals SS1 to SSn and the emission signals EM1 to EMn is generated in every one frame period. Each of the scan signals SS1 to SSn may be generated as a gate-on voltage Von during one horizontal period as shown in FIG. 3. The horizontal period indicates one horizontal line scanning period in which the data signals DS1 to DSm are respectively supplied to the pixels PX connected to one of the scan lines SL1 to SLn. The data signals DS1 to DSm may be supplied to the data lines DL1 to DLm in synchronization with the scan signals SS1 to SSn.

The one frame period may be divided into the first to fourth periods t1 to t4. The first period t1 may be a period for initializing the first node N1 connected to the control electrode of the driving transistor DT and applying an ON bias signal to the driving transistor DT. Further, the second period t2 may be a period for initializing the first node N1 connected to the control electrode of the driving transistor DT and the anode electrode of the organic light emitting diode OLED. The third period t3 may be a period during which the data signals DS1 to DSj are supplied, and the threshold voltage of the driving transistor DT is sensed. The fourth period t4 is a period during which the organic light emitting diode OLED emits light. The first and second periods t1 and t2 may be defined as an initialization period tini.

The (k−1)th scan signal SSk−1 is generated as the gate-on voltage Von during the first and second periods t1 and t2, and the kth scan signal SSk is generated as the gate-on voltage Von during the third period t3. The kth emission signal EMk is generated as the gate-on voltage Von during the fourth period t4 of the frame period FRN and the first period t1 of the subsequent frame period FRN+1. Each of the first to third periods t1, t2 and t3 may be appropriately determined in advance. The gate-on voltage Von corresponds to a turn-on voltage capable of turning on each of the first to sixth transistors ST1 to ST6. The gate-off voltage Voff corresponds to a turn-off voltage capable of turning off each of the first to sixth transistors ST1 to ST6.

Hereinafter, the structure for applying the first source voltage ELVSS and the second initialization voltage Vint2 will be described in more detail.

Figure 4:
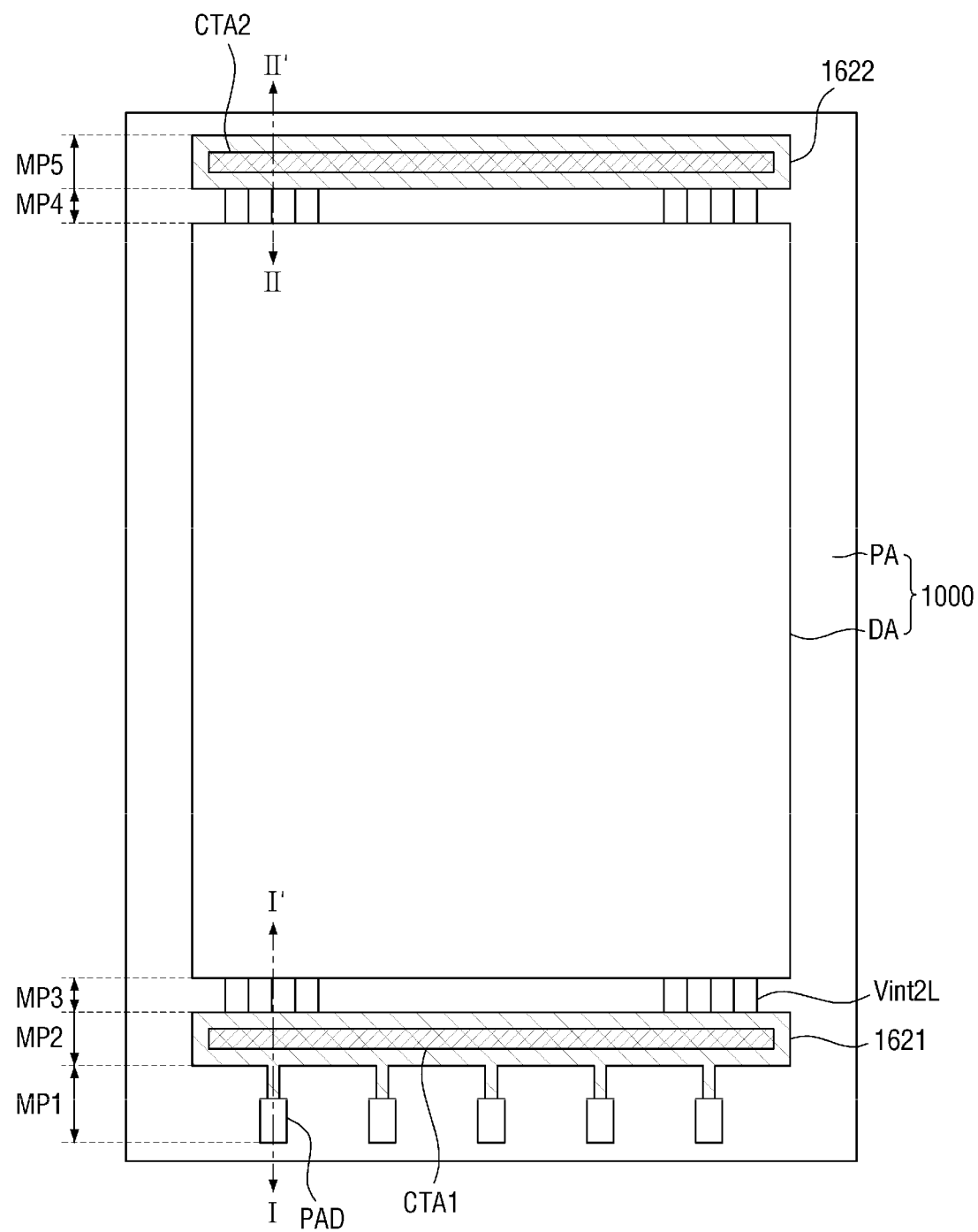
FIG. 4 is a layout diagram of the organic light emitting display device according to the embodiment.

FIG. 4 is a layout diagram of the organic light emitting display device according to the embodiment.

In FIG. 4, the shape and arrangement of the first power line VSSL disposed in a peripheral area PA of the organic light emitting display device will be mainly described.

Referring to FIG. 4, the organic light emitting display device may be divided into the display area DA and the peripheral area PA. The peripheral area PA may be arranged to surround the display area DA. The display area DA and the peripheral area PA may be defined on a lower substrate of the organic light emitting display device 1000.

The display area DA is an area in which an image is displayed, and a plurality of pixels PX are arranged.

A plurality of pads PAD, a first conductive pattern 1621, a second conductive pattern 1622 and a plurality of second initialization lines Vint2L are disposed in the peripheral area PA.

The pads PAD may be disposed on the peripheral area PA corresponding to one end of the display area DA. In addition, a larger or smaller number of pads than that shown in FIG. 4 may be arranged. The pads PAD are exposed to the outside through an opening formed of an insulating material, and a flexible printed circuit board (FPCB) may be attached on each of the pads PAD.

Each pad PAD may be provided with the first source voltage ELVSS from the power supply unit 50. The provided first source voltage ELVSS may be transmitted to the first conductive pattern 1621.

The first conductive pattern 1621 may be disposed on the peripheral area PA corresponding to one end of the display area DA where the pads PAD are arranged. More specifically, the first conductive pattern 1621 may be disposed in a region between the plurality of pads PAD and the display area DA and may be formed to extend along one side of the display area DA. The first conductive pattern 1621 may serve to transfer the first source voltage ELVSS provided from the pads PAD to the second initialization lines Vint2L.

Further, a first contact region CTA1 may be disposed on a region where the first conductive pattern 1621 is disposed. For example, the first contact region CTA1 may overlap the first conductive pattern 1621. The first contact region CTA1 may be defined as a region where the first conductive pattern 1621 and a first connection electrode 2501, which will be described later, are in contact with each other and electrically connected to each other. The first source voltage ELVSS provided to the first conductive pattern 1621 may be provided to the first connection electrode 2501 electrically connected through the first contact region CTA1, and the first source voltage ELVSS provided to the first connection electrode 2501 may be provided to a cathode electrode 230, which will be described later, of the organic light emitting diode OLED. Although not shown, the cathode electrode 230 may be arranged to overlap the entire surface of the display area DA.

A second conductive pattern 1622 may be disposed on the peripheral area PA corresponding to an end that is opposite to the one end of the display area DA where the first conductive pattern 1621 is disposed. More specifically, the second conductive pattern 1622 may be disposed to face the first conductive pattern 1621 with the display region DA interposed therebetween, and may be formed to extend along one side of the display region DA in parallel with the first conductive pattern 1621. The second conductive pattern 1622 may be connected to the plurality of second initialization lines Vint2L that pass through the display area DA. The second conductive pattern 1622 may receive the second initialization voltage Vint2 from the second initialization lines Vint2L.

Further, a second contact region CTA2 may be disposed on a region where the second conductive pattern 1622 is disposed. In other words, the second contact region CTA2 may overlap the first conductive pattern 1622. The second contact region CTA2 may be defined as a region where the second conductive pattern 1622 and a second connection electrode 2502, which will be described later, are in contact with each other and electrically connected to each other. The second conductive pattern 1622 may be electrically connected to the cathode electrode 230 of the organic light emitting diode OLED through the second connection electrode 2501. Thus, the second conductive pattern 1622 may receive the first source voltage ELVSS from the cathode electrode 230 of the organic light emitting diode OLED.

More specifically, the second conductive pattern 1622 may receive the second initialization voltage Vint2 from the plurality of second initialization lines Vint2L, and may receive the first source voltage ELVSS from the cathode electrode 230 of the organic light emitting diode OLED. Accordingly, the second conductive pattern 1622 may electrically connect the plurality of second initialization lines Vint2L with the cathode electrode 230 of the organic light emitting diode OLED to allow them to share the same voltage level.

As described above, since the first source voltage ELVSS and the second initialization voltage Vint2 have different transfer paths and different constituent elements and materials in their transfer paths, a voltage level difference may occur. Accordingly, the second conductive pattern 1622 is disposed in a region where the first source voltage ELVSS is first applied and is divided into the second initialization voltage Vint2, i.e., an end that is opposite to the one end of the display area DA where the pads PAD are arranged. Thus, a voltage level difference between the first source voltage ELVSS and the second initialization voltage Vint2 can be minimized in each pixel of the display area DA that is disposed adjacent to the region where the second conductive pattern 1622 is disposed.

Furthermore, the second conductive pattern 1622 can minimize a degree of a voltage drop in the first source voltage ELVSS that is provided to the pixel disposed away from the pads PAD. As will be described later, the cathode electrode 230 that transmits the first source voltage ELVSS may be formed of a transparent material having a high resistance. Thus, the resistance may be higher than the path including the plurality of second initialization lines Vint2 that is formed of a metal material having a relatively high conductivity. Nevertheless, since the second conductive pattern 1622 provides the second initialization voltage Vint2 having a voltage value closer to the first source voltage ELVSS before the voltage drop to the cathode electrode 230 that is disposed adjacent thereto, the voltage drop of the first source voltage ELVSS can be minimized.

Figure 5:
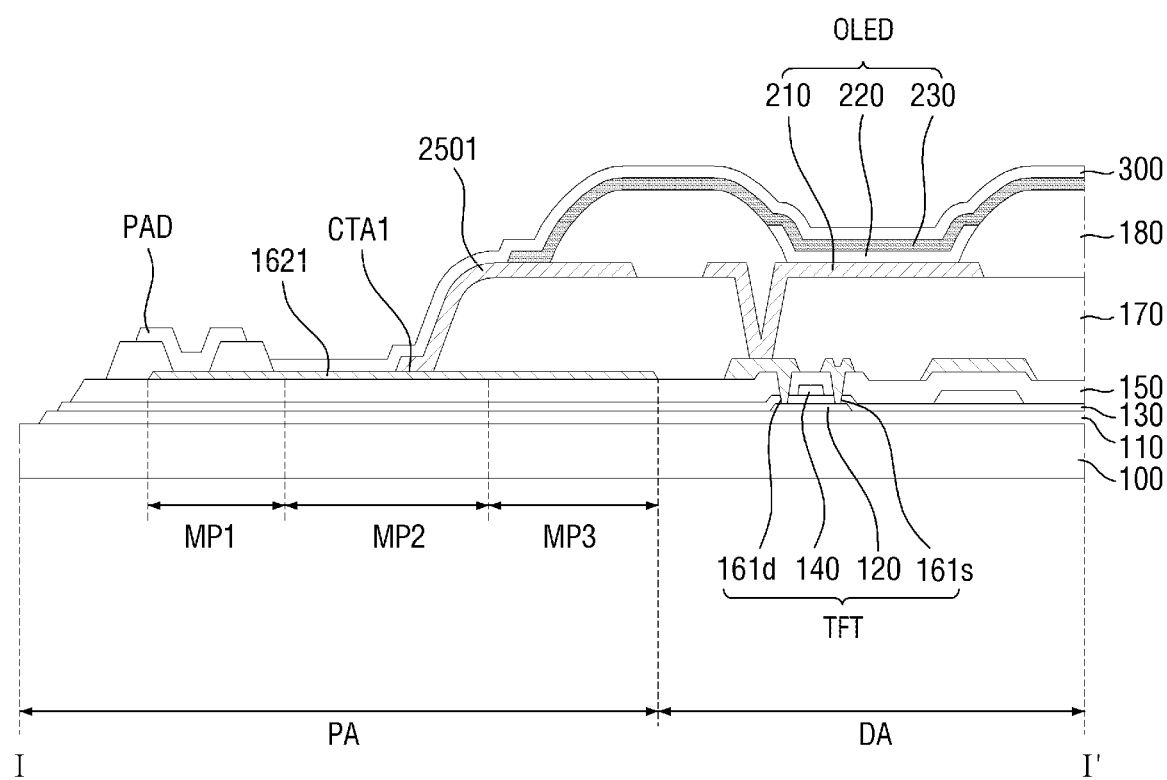
FIG. 5 is a cross-sectional view taken along line I-I' of FIG. 4.
Figure 6:
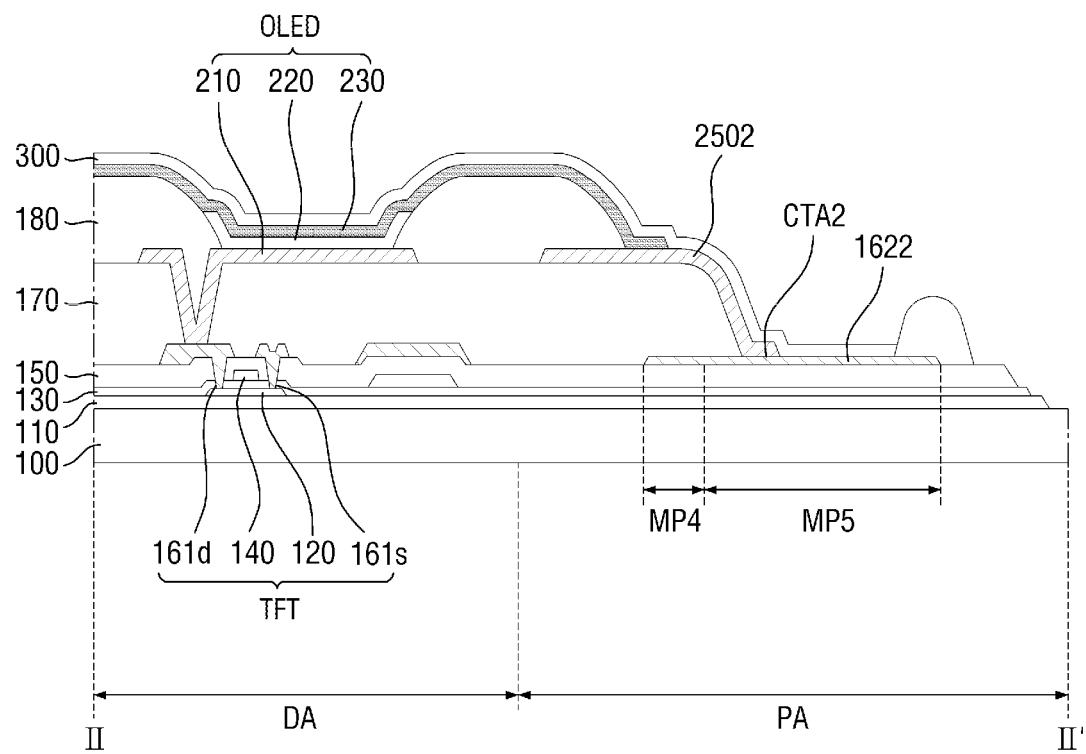
FIG. 6 is a cross-sectional view taken along line II-II' of FIG. 4.

FIG. 5 is a cross-sectional view taken along line I-I' of FIG. 4. FIG. 6 is a cross-sectional view taken along line II-II' of FIG. 4.

Referring to FIGS. 5 and 6, the display area DA and the peripheral area PA are defined on a lower substrate 100. The lower substrate 100 may be an insulating substrate. The lower substrate 100 may include a glass substrate, a quartz substrate, a ceramic substrate, or a plastic substrate. The lower substrate 100 may be a flexible substrate that can be bent, folded, or rolled in another embodiment. In this case, the lower substrate 100 may include polyimide, but the present disclosure is not limited thereto.

In the display area DA and the peripheral area PA defined on the lower substrate 100, the cross-sectional structure of the display area DA will be described in detail.

First, a buffer layer 110 that is formed of silicon oxide, silicon nitride, or the like, is disposed on the lower substrate 100 to planarize the upper surface of the lower substrate 100 and to prevent impurities or the like from penetrating into a semiconductor layer 120 to be described later.

The semiconductor layer 120 is disposed on the buffer layer 110. The semiconductor layer 120 may be formed of a material or by mixing at least two or more materials selected from amorphous silicon, polycrystalline silicon, single crystal silicon, and low temperature polycrystalline silicon. In some embodiments, the semiconductor layer 120 may include an oxide semiconductor.

A first insulating layer 130 is disposed on the semiconductor layer 120. The first insulating layer 130 may be formed of an insulating material to ensure insulation between the semiconductor layer 120 and a gate electrode 140 to be described later. For example, the first insulating layer 130 may be formed of an inorganic insulating material such as silicon oxide and/or silicon nitride, or an organic insulating material such as an acrylic organic material or benzocyclobutene (BCB).

The gate electrode 140 is disposed on the semiconductor layer 120. A source electrode 161s and a drain electrode 161d may be electrically coupled in accordance with a signal applied to the gate electrode 140. The gate electrode 140 may be formed to have a single layer or multilayer structure using one or more materials of, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) in consideration of adhesion to adjacent layers, surface flatness of stacked layers, and processability.

A second insulating layer 150 may be disposed on the semiconductor layer 120. The second insulating layer 150 may be interposed between the gate electrode 140 and the source electrode 160s and the drain electrode 160d to ensure insulation between the gate electrode 140 and the source electrode 161s and the drain electrode 161d. The second insulating layer 150 may be formed to have a single layer or multilayer structure using an organic insulating material such as an acrylic organic material or benzocyclobutene (BCB).

On the second insulating layer 150, the source electrode 161s and the drain electrode 161d are disposed. The source electrode 161s and the drain electrode 161d may be electrically connected to the semiconductor layer 120 through the second insulating layer 150 and contact holes formed in the first insulating layer 130, respectively. The source electrode 161s and the drain electrode 161d may be formed to have a single layer or multilayer structure using one or more materials of, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) in consideration of conductivity and the like.

Meanwhile, although not shown in the drawings, to protect a thin film transistor (TFT) formed of the semiconductor layer 120, the gate electrode 140, the source electrode 161s, and the drain electrode 161d, a passivation film (not shown) may be disposed to cover the thin film transistor TFT. The passivation film may be formed of an inorganic material such as silicon oxide, silicon nitride, or silicon oxynitride.

A planarization layer 170 may be disposed on the source electrode 161s and the drain electrode 161d. In this case, the planarization layer 170 may be a passivation film. The planarization layer 170 serves to substantially flatten the upper surface of the thin film transistor TFT and to protect the thin film transistor TFT and various devices when an organic light emitting device 200 is disposed on the thin film transistor TFT. The planarization layer 170 may be formed of, for example, an acrylic organic material or benzocyclobutene (BCB).

The thin film transistor TFT formed of the semiconductor layer 120, the gate electrode 140, the source electrode 161s and the drain electrode 161d may correspond to the structure of the driving transistor DT and the first to sixth transistors ST1 to ST6 constituting the pixel PX shown in FIG. 2.

A pixel defining layer 180 may be disposed on the thin film transistor TFT. The pixel defining layer 180 may be disposed on the planarization layer 170 and may have an opening. The pixel defining layer 180 serves to define a region where the pixel PX is disposed on the lower substrate 100. The pixel defining layer 180 may be formed of, for example, an organic insulating material. The organic insulating material may include an acrylic polymer such as polymethyl methacrylate (PMMA), polystyrene (PS), a polymer derivative having a phenol group, an imide polymer, an arylether polymer, an amide polymer, a fluorine-based polymer, a p-xylene-based polymer, a vinyl alcohol-based polymer, and a mixture thereof.

An organic light emitting diode OLED may be disposed on the pixel defining layer 180. The organic light emitting diode OLED may include an anode electrode 210, an intermediate layer 220 including an emission layer (EML), and a cathode electrode 230.

The anode electrode 210 may be a (semi)transparent electrode or a reflective electrode. In the case of a (semi) transparent electrode, the anode electrode 210 may be formed of, for example, ITO, IZO, ZnO, $In_2O_3$, IGO or AZO. In the case of a reflective electrode, the anode electrode 210 may have a reflective film formed of Ag, Mg, Al, Pt, Pd, Au, Ni, Nd, Ir, Cr, or a compound thereof and a layer formed of ITO, IZO, ZnO, $In_2O_3$, IGO, or AZO. Of course, the present disclosure is not limited thereto, but the anode electrode 210 may be formed of various materials, its structure may be a single layer or multilayer structure, and various modifications are possible without deviating from the scope of the present disclosure.

The intermediate layer 220 may be disposed in each pixel region defined by the pixel defining layer 180. The intermediate layer 220 may include an emission layer (EML) that emits light by an electrical signal, and may be formed by stacking, in addition to the emission layer (EML), a hole transport layer (HTL) and a hole injection layer (HIL) that are disposed between the emission layer (EML) and the anode electrode 210, and an electron injection layer (EIL) and an electron transport layer (ETL) that are disposed between the emission layer (EML) and the cathode electrode 230 in a single or composite structure. Of course, the intermediate layer 220 is not necessarily limited thereto, and may have various structures.

The cathode electrode 230 facing the anode electrode 210 and covering the intermediate layer 220 including the emission layer (EML) may be disposed over the entire surface of the lower substrate 100. The cathode electrode 230 may be a (semi)transparent electrode or a reflective electrode.

In the case of a (semi)transparent electrode, the cathode electrode 230 may have a layer formed of metal having a low work function, i.e., Li, Ca, LiF/Ca, LiF/Al, Al, Ag, Mg, or a compound thereof, and a (semi)transparent conductive layer such as ITO, IZO, ZnO, or $In_2O_3$. In the case of a reflective electrode, the cathode electrode 230 may have a layer formed of Li, Ca, LiF/Ca, LiF/Al, Al, Ag, Mg, or a compound thereof. Of course, the configuration and material of the cathode electrode 230 are not limited thereto, and various modifications are possible without deviating from the scope of the present disclosure. Further, in the present embodiment, an embodiment in which an electrode that is disposed below the intermediate layer 220 is the anode electrode 210 and an electrode that is disposed above the intermediate layer 220 is the cathode electrode 230 has been described as an example, but it is understood that the opposite case is also possible without deviating from the scope of the present disclosure.

A thin film encapsulation layer 300 may be disposed on the cathode electrode 230. Although not shown, the thin film encapsulation layer 300 may have a multilayer structure in which one or more organic films and inorganic films are alternately stacked.

The thin film encapsulation layer 300 may be formed on the entire surface of the display area DA to cover the organic light emitting diode OLED and may be disposed to extend to a partial region of the peripheral area PA that is adjacent to the display area DA.

Hereinafter, the cross-sectional structure of the peripheral area PA defined on the lower substrate 100 will be described in detail.

In the peripheral area PA, the buffer layer 110 is disposed on the lower substrate 100.

The first insulating layer 130 is disposed on the buffer layer 110. Although not shown, signal lines for providing various signals to the pixels arranged in the display area DA may be additionally disposed between the buffer layer 110 and the first insulating layer 130. The signal lines may be formed of the same material as the gate electrode 140.

The second insulating layer 150 is disposed on the first insulating layer 130.

Referring to FIGS. 5 and 6, the first conductive pattern 1621 and the second conductive pattern 1622 are disposed on the second insulating layer 150. The first conductive pattern 1621 and the second conductive pattern 1622 may be formed of the same material as the source electrode 161s and the drain electrode 161d.

The planarization layer 170 is disposed on the first conductive pattern 1621 and the second conductive pattern 1622. The planarization layer 170 tends to decrease its height toward the outer periphery of the peripheral area PA and may include an opening for exposing the pads PAD in a region where the pads PAD are disposed.

The first connection electrode 2501, the second connection electrode 2502, and the pads PAD are disposed on the planarization layer 170.

The first connection electrode 2501 may be electrically connected to the first conductive pattern 1621 in the first contact region CTA1, and the second connection electrode 2502 may be electrically connected to the second contact electrode CTA2 in the second contact region CTA2. The first connection electrode 2501 and the second connection electrode 2502 may be formed of the same material as the anode electrode 210 of the organic light emitting diode OLED.

In the present embodiment, the first connection electrode 2501 and the second connection electrode 2502 may be disposed along a sidewall of a portion where the height of the planarization layer 170 decreases.

Meanwhile, the peripheral area PA may include first to fifth pattern regions MP1 to MP5. Here, in the first pattern region MP1, the first conductive pattern 1621 and each pad PAD may be electrically connected. In the second pattern region MP2, the first conductive pattern 1621 and the first connection electrode 2501 may be electrically connected. In other words, the first contact region CTA1 may be disposed in the second pattern region MP2. The second initialization lines Vint2L may be disposed in the third pattern region MP3. The second initialization lines Vint2L may be formed integrally with the first conductive pattern 1621.

In the fourth pattern region MP4, the second initialization lines Vint2L extending from the third pattern region MP3 and disposed across the display area DA may be disposed.

In the fifth pattern region MP5, the second conductive pattern 1622 that is electrically connected to the second initialization lines Vint2L may be disposed. Further, in the fifth pattern region MP5, the second contact region CTA2 may be disposed in which the second conductive pattern 1622 and the second connection electrode 2502 are in contact with and electrically connected to each other.

Figure 7:
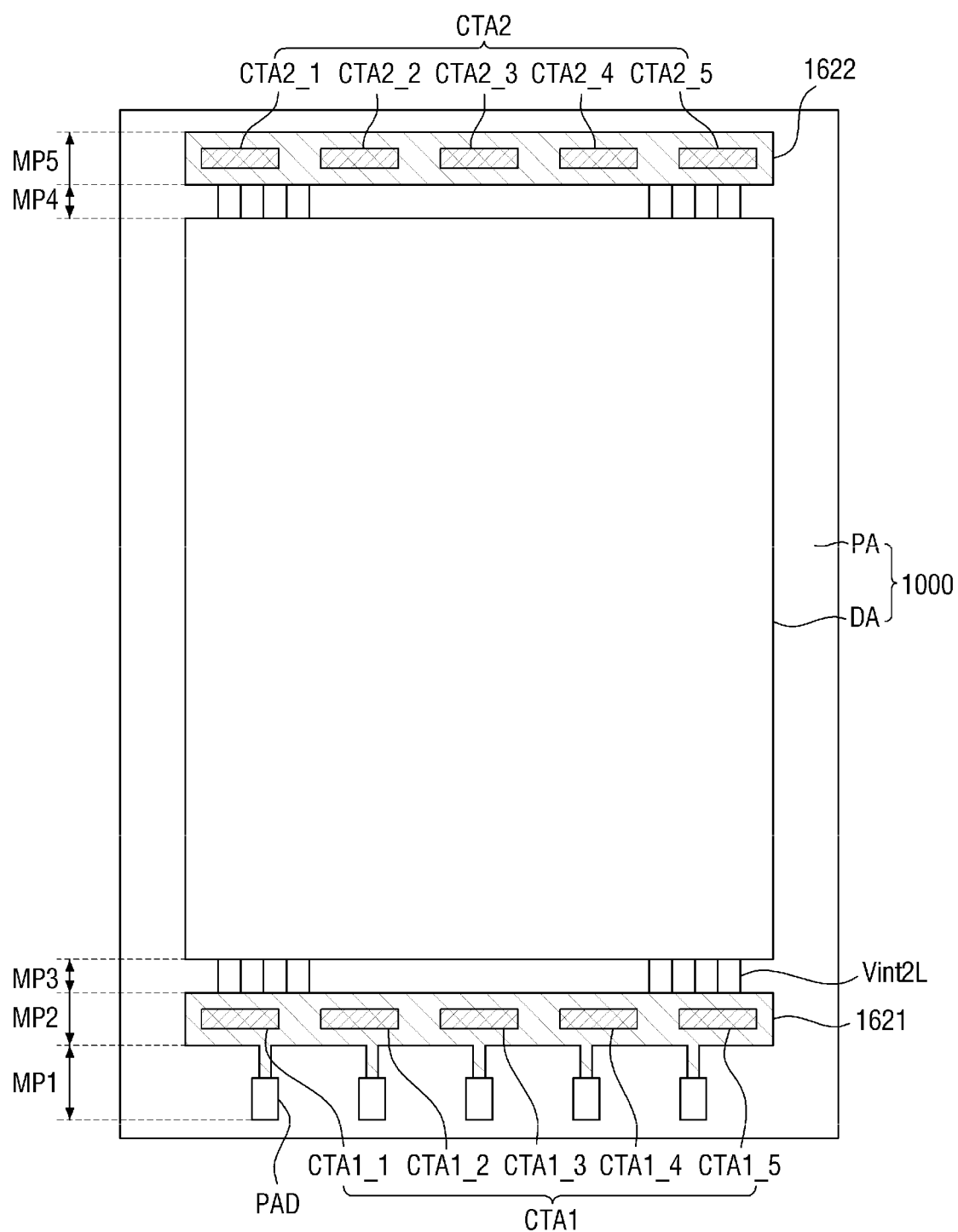
FIG. 7 is a layout diagram of an organic light emitting display device according to another embodiment.

FIG. 7 is a layout diagram of an organic light emitting display device according to another embodiment.

In FIG. 7, a description of constituent elements and reference numerals that are the same as those described with reference to FIGS. 1 to 6 will be omitted.

Referring to FIG. 7, the organic light emitting display device 1000 may be divided into a display area DA and a peripheral area PA.

A plurality of pads PAD, a first conductive pattern 1621, a second conductive pattern 1622, and a plurality of second initialization lines Vint2L are disposed in the peripheral area PA.

A first contact region CTA1 including a plurality of first sub contact regions CTA1_1 to CTA1_5 is disposed on a region where the first conductive pattern 1621 is disposed. In the structure shown in the present embodiment, unlike the structure shown in FIG. 4, the first conductive pattern 1621 and the first connection electrode 2501 may be electrically connected by making contacts through a plurality of divided regions.

Similarly, a second contact region CTA2 including a plurality of second sub contact regions CTA2_1 to CTA2_5 is disposed on a region where the second conductive pattern 1622 is disposed. In the structure shown in the present embodiment, unlike the structure shown in FIG. 4, the second conductive pattern 1622 and the second connection electrode 2502 may be electrically connected by making contacts through a plurality of divided regions.

Figure 8:
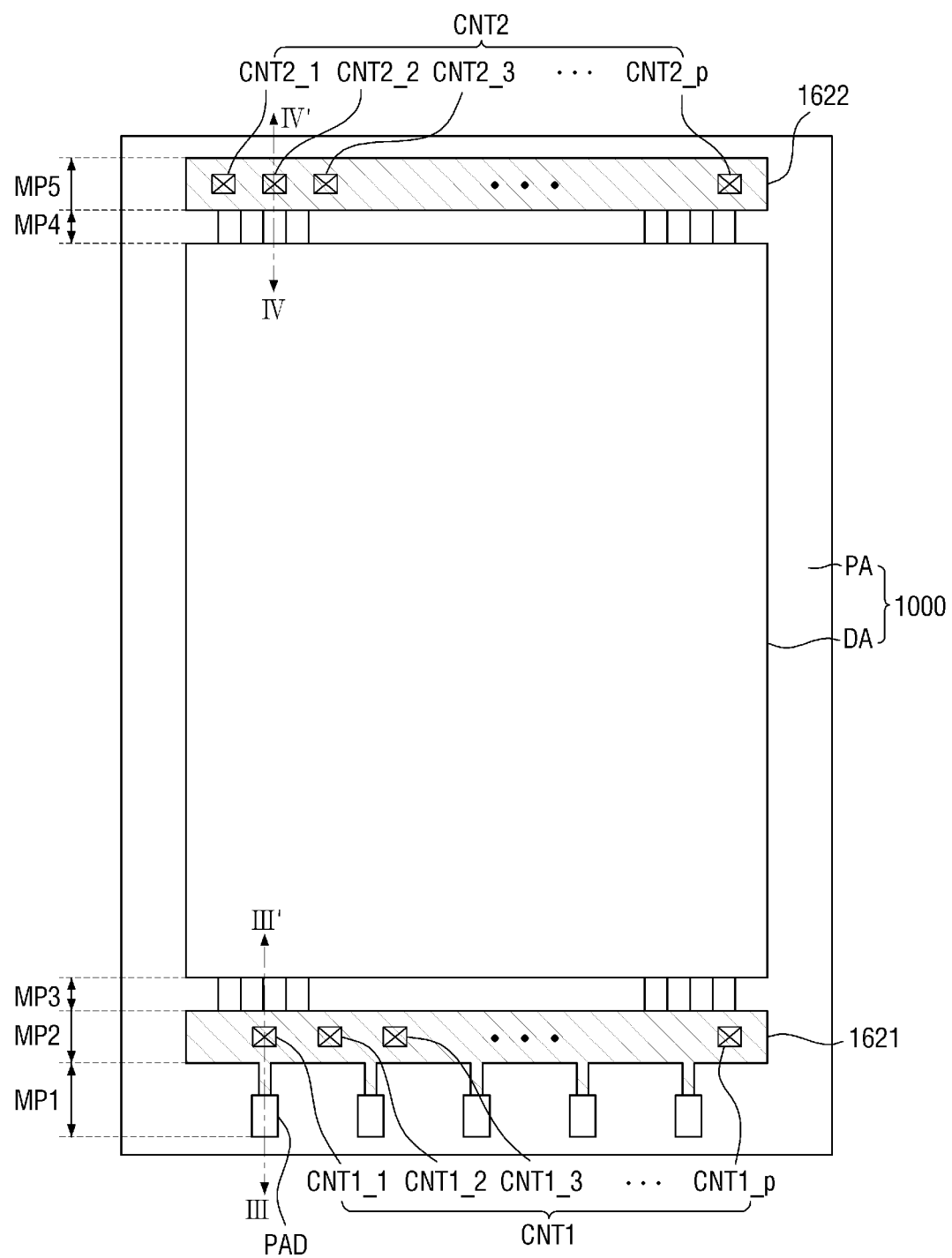
FIG. 8 is a layout diagram of an organic light emitting display device according to still another embodiment.
Figure 9:
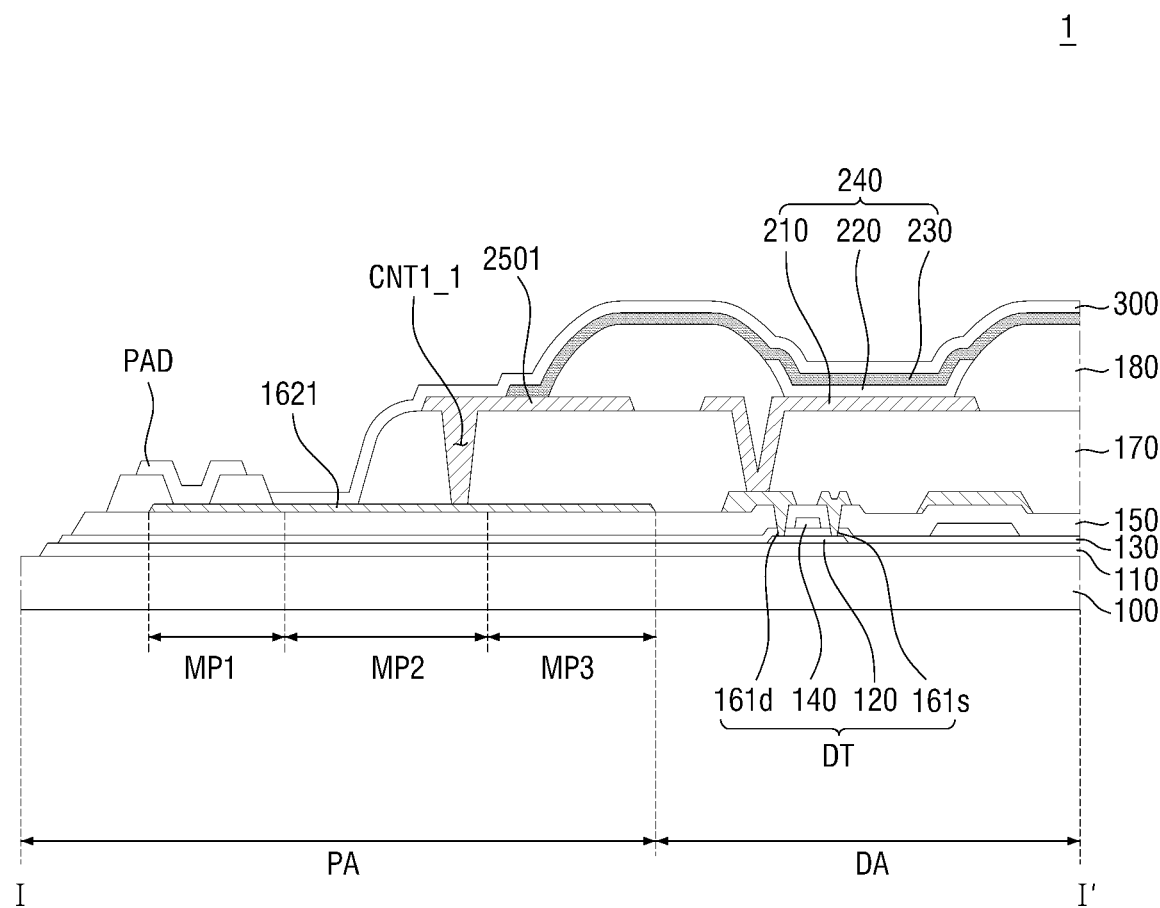
FIG. 9 is a cross-sectional view taken along line III-III' of FIG. 8.

FIG. 8 is a layout diagram of an organic light emitting display device according to still another embodiment. FIG. 9 is a cross-sectional view taken along line III-III' of FIG. 8, and FIG. 10 is a cross-sectional view taken along line IV-IV' of FIG. 8.

Figure 10:
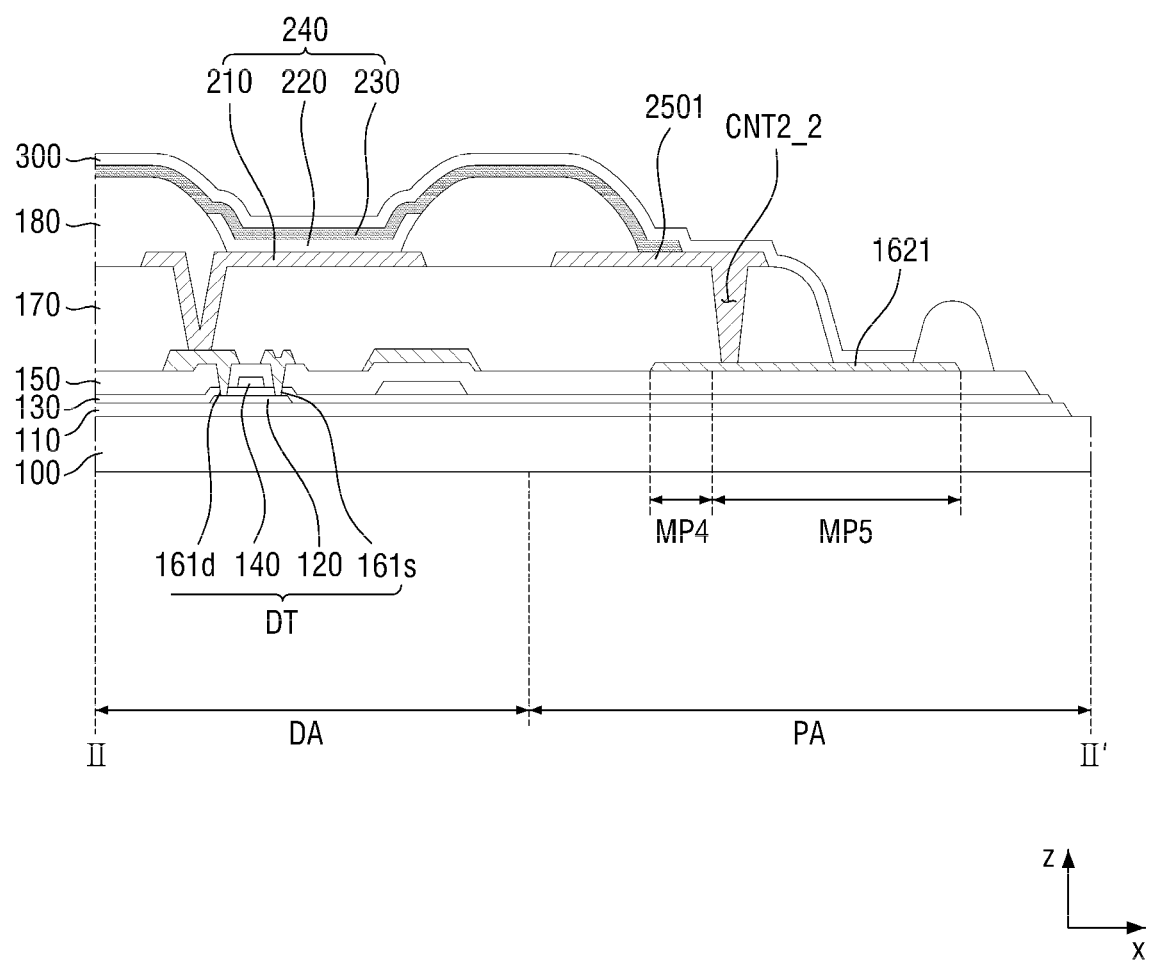
FIG. 10 is a cross-sectional view taken along line IV-IV' of FIG. 8.

In FIGS. 8 to 10, a description of constituent elements and reference numerals that are the same as those described with reference to FIGS. 1 to 7 will be omitted.

Referring to FIGS. 8 to 10, a plurality of pads PAD, a first conductive contact hole CNT1, a second conductive contact hole CNT2, and a plurality of second initialization lines Vint2L are disposed in the peripheral area PA.

The first conductive contact hole CNT1 includes a plurality of first sub conductive contact holes CNT1_1 to CNT1_p (where p is a natural number greater than 1). Further, the second conductive contact hole CNT2 includes a plurality of second sub conductive contact holes CNT2_1 to CNT2_p.

That is, unlike the first conductive pattern 1621 of the embodiment shown in FIG. 4 that is electrically connected to the first connection electrode 2501 disposed along the sidewall of the planarization layer 170 in the first contact region CTA1, the first conductive pattern 1621 according to the present embodiment may be electrically connected to the first connection electrode 2501 through the plurality of first sub conductive contact holes CNT1_1 to CNT1_p that is formed through the planarization layer 170.

Similarly, the second conductive pattern 1622 according to the present embodiment may be electrically connected to the second connection electrode 2502 through the plurality of second sub conductive contact holes CNT2_1 to CNT2_p that is formed through the planarization layer 170.

Figure 11:
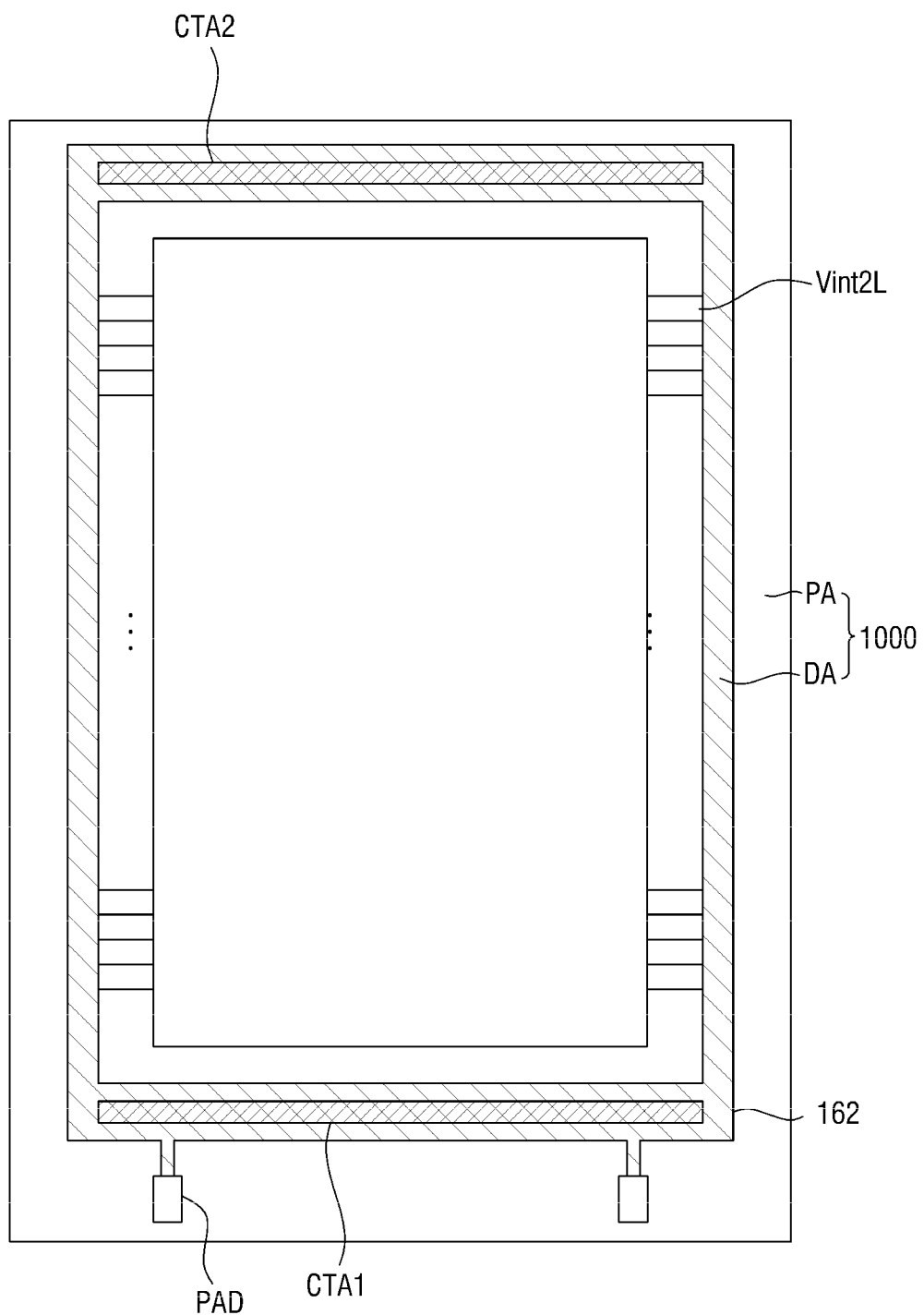
FIG. 11 is a layout diagram of an organic light emitting display device according to still another embodiment.

FIG. 11 is a layout diagram of an organic light emitting display device according to still another embodiment.

In FIG. 11, a description of constituent elements and reference numerals that are the same as those described with reference to FIGS. 1 to 6 will be omitted.

Referring to FIG. 11, the organic light emitting display device may be divided into a display area DA and a peripheral area PA.

A plurality of pads PAD, a conductive pattern 162, and a plurality of second initialization lines Vint2L are arranged in the peripheral area PA.

The conductive pattern 162 may be formed of the same material in the same layer as the first conductive pattern 1621 and the second conductive pattern 1622 of the organic light emitting diode display device 1000 according to the embodiment shown in FIG. 4. However, alternatively, the conductive pattern 162 may be disposed integrally in the peripheral area PA in a shape surrounding the display area DA. Thus, the plurality of second initialization lines Vint2L may be arranged to pass through the display area DA on the sides where the pads PAD are not disposed substantially in parallel with the extended direction of the first contact region CTA1 and the second contact region CTA2.

However, also in the present embodiment, similarly to the embodiment shown in FIG. 4, the first contact region CTA1 and the second contact region CTA2 may be respectively disposed at one end of the display area DA in which the pads PAD are disposed and an end that is opposite to the one end of the display area DA.

Effects of the present disclosure are not limited to the above description, and more various effects are included in the present disclosure.

Although the embodiments of the present disclosure have been described above, they are merely examples and not intended to limit the present disclosure, and it should be appreciated that various modifications and applications not described above may be made by one of ordinary skill in the art without departing from the essential features of the embodiments. For example, each of components described in detail in the embodiments of the present disclosure may be implemented in a modifiable manner. In addition, differences related to such modifications and applications should be understood as being included in the scope of the present disclosure defined by the attached claims.

What is claimed is:

1. An organic light emitting display device comprising:
   a substrate having a display area in which a plurality of pixels including an organic light emitting diode is arranged and a peripheral area surrounding the display area;
   a pad disposed on the substrate in the peripheral area;
   a first conductive pattern disposed on the substrate in the peripheral area adjacent to a first side of the display area and electrically connected to the pad;
   a second conductive pattern disposed on the substrate in the peripheral area adjacent to a second side of the display area that is opposite from the first side of the display area in a plan view with the display area interposed between the first conductive pattern and the second conductive pattern;
   a first connection electrode disposed on the first conductive pattern in the peripheral area and electrically connected to the first conductive pattern; and
   a second connection electrode disposed on the second conductive pattern in the peripheral area and electrically connected to the second conductive pattern,
   wherein a cathode electrode of the organic light emitting diode is disposed on the first connection electrode and the second connection electrode and electrically connected to the first connection electrode and the second connection electrode.

2. The organic light emitting display device of claim 1, wherein the first conductive pattern and the second conductive pattern are electrically connected through a plurality of conductive lines disposed to pass through the display area, and
   wherein the plurality of conductive lines is disposed on the same layer as the first conductive pattern and the second conductive pattern.

3. The organic light emitting display device of claim 2, wherein an anode electrode of the organic light emitting diode is initialized to a voltage level provided to the conductive lines.

4. The organic light emitting display device of claim 2, wherein the conductive lines are formed of the same material as the first conductive pattern and the second conductive pattern.

5. The organic light emitting display device of claim 1, wherein the first conductive pattern and the first connection electrode are electrically connected through a first contact region, and
   wherein the first contact region overlaps the first conductive pattern.

6. The organic light emitting display device of claim 5, wherein the second conductive pattern and the second connection electrode are electrically connected through a second contact region, and
   wherein the second contact region overlaps the second conductive pattern.

7. The organic light emitting display device of claim 1, wherein the first connection electrode and the second connection electrode are disposed on the same layer as an anode electrode of the organic light emitting diode.

8. The organic light emitting display device of claim 7, wherein the first connection electrode and the second connection electrode are formed of the same material as the anode electrode of the organic light emitting diode.

9. The organic light emitting display device of claim 1, wherein the pad and the first conductive pattern are disposed at one end of the display area, and
   wherein the second conductive pattern is disposed at an end opposite to the one end of the display area where the pad and the first conductive pattern are disposed.

10. The organic light emitting display device of claim 1, wherein each of the pixels further includes a driving transistor having a control electrode connected to a first node, a first electrode connected to a second node, and a second electrode connected to a third node, and
    wherein the organic light emitting diode emits light according to a drain-source current flowing through the driving transistor.

11. The organic light emitting display device of claim 10, wherein the cathode electrode of the organic light emitting diode receives a first source voltage.

12. The organic light emitting display device of claim 11, wherein an anode electrode of the organic light emitting diode is initialized to the first source voltage.

13. The organic light emitting display device of claim 12, wherein a control electrode of the driving transistor is initialized to a first initialization voltage.

14. The organic light emitting display device of claim 13, wherein the first initialization voltage has a voltage level higher than the first source voltage.

15. The organic light emitting display device of claim 10, wherein the cathode electrode receives a first source voltage.

16. The organic light emitting display device of claim 15, wherein an anode electrode of the organic light emitting diode is initialized to the first source voltage.

17. An organic light emitting display device comprising:
    a substrate having a display area in which a plurality of pixels including an organic light emitting diode are arranged and a peripheral area surrounding the display area;
    a pad disposed on the substrate in the peripheral area and a conductive pattern electrically connected to the pad and disposed to surround the display area; and
    a first connection electrode and a second connection electrode disposed on the conductive pattern in the peripheral area and electrically connected to the conductive pattern,
    wherein a cathode electrode of the organic light emitting diode is disposed on the first connection electrode and the second connection electrode and electrically connected to the first connection electrode and the second connection electrode,
    wherein the first connection electrode is disposed in the peripheral area adjacent to a first end of the display area in which the pad is disposed, and
    wherein the second connection electrode is disposed in the peripheral area adjacent to a second end that is opposite to the first end of the display area in a plan view with the display area interposed between the first connection electrode and the second connection electrode.

18. The organic light emitting display device of claim 17, wherein the conductive pattern is electrically connected to a plurality of conductive lines disposed to pass through the display area, and wherein the plurality of conductive lines is disposed on the same layer as the conductive pattern.

19. The organic light emitting display device of claim 17, wherein the conductive pattern and the first connection electrode are electrically connected through a first contact region, wherein the conductive pattern and the second connection electrode are electrically connected through a second contact region, and wherein the first contact region and the second contact region are spaced apart with the display area interposed between the first contact region and the second contact region and disposed to overlap the conductive pattern.

20. The organic light emitting display device of claim 17, wherein each of the pixels further includes a driving transistor having a control electrode connected to a first node, a first electrode connected to a second node, and a second electrode connected to a third node, and wherein the organic light emitting diode emits light according to a drain-source current flowing through the driving transistor.

\* \* \* \* \*